US007868986B2

(12) United States Patent
You (10) Patent No.: US 7,868,986 B2
(45) Date of Patent: Jan. 11, 2011

(54) LIQUID CRYSTAL DISPLAY HAVING A DRIVER CONTACT STRUCTURE FOR PREVENTING CORROSION OF CONDUCTIVE FILMS

(75) Inventor: Chun-Gi You, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 18 days.

(21) Appl. No.: 12/353,045

(22) Filed: Jan. 13, 2009

(65) Prior Publication Data

US 2009/0179204 A1 Jul. 16, 2009

Related U.S. Application Data (63) Continuation of application No. 10/986,651, filed on Nov. 12, 2004, now Pat. No. 7,486,367.

(30) Foreign Application Priority Data

Nov. 12, 2003 (KR) ...................... 10-2003-0079693

(51) Int. Cl.
G02F 1/1333 (2006.01)
G02F 1/1345 (2006.01)
G09G 3/30 (2006.01)
G09G 3/36 (2006.01)
H01L 27/14 (2006.01)
(52) U.S. Cl. .................... 349/148; 349/54; 349/151; 349/152; 345/80; 345/90; 257/72
(58) Field of Classification Search ............... 349/149, 349/54, 151, 152; 345/80, 90; 257/72
See application file for complete search history.

(56) References Cited

U.S. PATENT DOCUMENTS

| 5,825,449 | A | | 10/1998 | Shin | |
|---|---|---|---|---|---|
| 5,835,177 | A | * | 11/1998 | Dohjo et al. | ................. 349/147 |
| 6,406,946 | B1 | * | 6/2002 | Takizawa et al. | ............ 438/149 |
| 7,486,367 | B2 | * | 2/2009 | You | ........................... 349/149 |
| 2002/0051110 | A1 | | 5/2002 | Kim | |
| 2003/0164919 | A1 | * | 9/2003 | Oh et al. | ..................... 349/149 |

FOREIGN PATENT DOCUMENTS

| JP | 09-189924 | 7/1997 |
|---|---|---|
| JP | 11-258627 | 9/1999 |
| JP | 11-352511 | 12/1999 |
| JP | 2000-137445 | 5/2000 |
| KR | 10-0250853 | 5/1997 |

* cited by examiner

Primary Examiner—Mike Qi
(74) Attorney, Agent, or Firm—F. Chau & Associates, LLC (57) ABSTRACT

A display panel including first to third conductive films is provided, which includes: a first signal line including a first portion that includes the first conductive film, an intermediate portion that includes at least two of the first to the third conductive films ("intermediate portion films"), and a contact portion that contacts an output terminal of a driving circuit and includes the intermediate portion films except for at least one of the intermediate portion films; a second signal line intersecting the first signal line and including the second conductive film; a switching element connected to the first and the second signal lines; and a pixel electrode connected to the switching element and including the third conductive film.

8 Claims, 8 Drawing Sheets

LIQUID CRYSTAL DISPLAY HAVING A DRIVER CONTACT STRUCTURE FOR PREVENTING CORROSION OF CONDUCTIVE FILMS

CROSS-REFERENCE TO RELATED APPLICATIONS

This application is a continuation of U.S. patent application Ser. No. 10/986,651, filed Nov. 12, 2004 now U.S. Pat. No. 7,486,367, which claims priority to Korean Patent Application No. 2003-79693, filed Nov. 12, 2003, the contents of which are herein incorporated by reference in their entireties.

BACKGROUND OF THE INVENTION (a) Field of the Invention

The present invention relates to a display panel.

(b) Description of Related Art

A flat panel display such as a liquid crystal display (LCD) and an organic light emitting display (OLED) includes a display panel including a plurality of pixels and a plurality of signal lines connected thereto, a plurality of drivers for driving the display panel, and a controller for controlling the drivers.

The drivers usually include a plurality of integrated circuit (IC) chips that are mounted on flexible printed circuit (FPC) films attached to the display panel or mounted directly on the display panel. The driver chips are supplied with control signals and driving voltages from a printed circuit board (PCB) that mount a plurality of circuit elements including the controller and a voltage generator.

When the driving chips are mounted directly on the display panel, FPC films including a plurality of conductive lines are provided between the display panel and the PCB for transmitting control signals, driving voltages, and image data. The FPC films are attached to the display panel and the electrical connection between the FPC films and the driving chips is implemented by a plurality of lead lines formed on the display panel. The driving chips generate display signals based on signals and voltages from the FPC films and apply the display signals to the signal lines on the display panel.

The lead lines on the display panel have contact portions contacting the FPC films and the driving chips, and the signal lines on the display panel also have contact portions contacting the driving chips.

The contact portions may include several conductive films. The contact between the conductive films and between the contact portions and the driving chips or the FPC films are often defected and the poor contact may cause corrosion of the conductive films to disconnect the transmission of signals and voltages. Accordingly, it is required to provide reliable contact structures.

SUMMARY OF THE INVENTION

A display panel including first to third conductive films is provided, which includes: a first signal line including a first portion that includes the first conductive film, an intermediate portion that includes at least two of the first to the third conductive films ("intermediate portion films"), and a contact portion that contacts an output terminal of a driving circuit and includes the intermediate portion films except for at least one of the intermediate portion films; a second signal line intersecting the first signal line and including the second conductive film; a switching element connected to the first and the second signal lines; and a pixel electrode connected to the switching element and including the third conductive film.

The intermediate portion films may include the first and the second conductive films.

The first conductive film may include Cr, Mo, or Mo alloy and the second conductive film comprises Al or Al alloy.

The contact portion may not include the second conductive film.

The display panel may further include an insulating film disposed between the first conductive film and the second conductive film and having at least a contact hole connecting the first conductive film and the second conductive film, wherein the intermediate portion further comprises the third conductive film.

The contact portion may further include the third conductive film.

The third conductive film may include transparent conductor or reflective conductor.

The display panel may further include a third signal line disposed near the contact portion.

The third signal line may include the first and the second conductive films.

The first signal line may further include an extension connected to the contact portion and disposed between the contact portion and the third signal line.

The extension may include the first conductive film.

The switching element may include a polysilicon film disposed under the second signal line.

A display panel including first to third conductive films is provided, which includes: a first signal line including a first conductive film; a second signal line intersecting the first signal line and including a second conductive film; a switching element connected to the first and the second signal lines; a pixel electrode connected to the switching element and including a third conductive film; and a third signal line separated from the first and the second signal lines and including a first contact portion that contacts an external device and includes at least one of the first to the third conductive films, a second contact portion that contacts an input terminal of a driving circuit and includes at least one of the first to the third conductive films, and an intermediate portion that connects the first contact portion and the second contact portion and includes the first and the second conductive films.

The first and the second contact portions may include the first and the second conductive films.

The first conductive film may include Cr, Mo, or Mo alloy and the second conductive film comprises Al or Al alloy.

The display panel may further include: a first insulating film disposed between the first conductive film and the second conductive film and having a plurality of contact holes connecting the first conductive film and the second conductive film at the first and the second contact portions; and first and second contact assistants including the third conductive film and disposed on the first and the second contact portions.

The first and the second contact assistants may substantially fully cover the first and the second contact portions.

The display panel may further include a second insulating film disposed on the first insulating film opposite the intermediate portion, wherein the first and the second contact assistants extend onto the second insulating film.

The first and the second contact assistants may include transparent conductor or reflective conductor.

The switching element may include a polysilicon film disposed under the second signal line.

BRIEF DESCRIPTION OF THE DRAWINGS

The present invention will become more apparent by describing embodiments thereof in detail with reference to the accompanying drawing in which.

DETAILED DESCRIPTION OF EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein. Like numerals refer to like elements throughout.

In the drawings, the thickness of layers and regions are exaggerated for clarity. Like numerals refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Then, liquid crystal displays as an example of display device according to embodiments of the present invention will be described with reference to the accompanying drawings.

Figure 1:
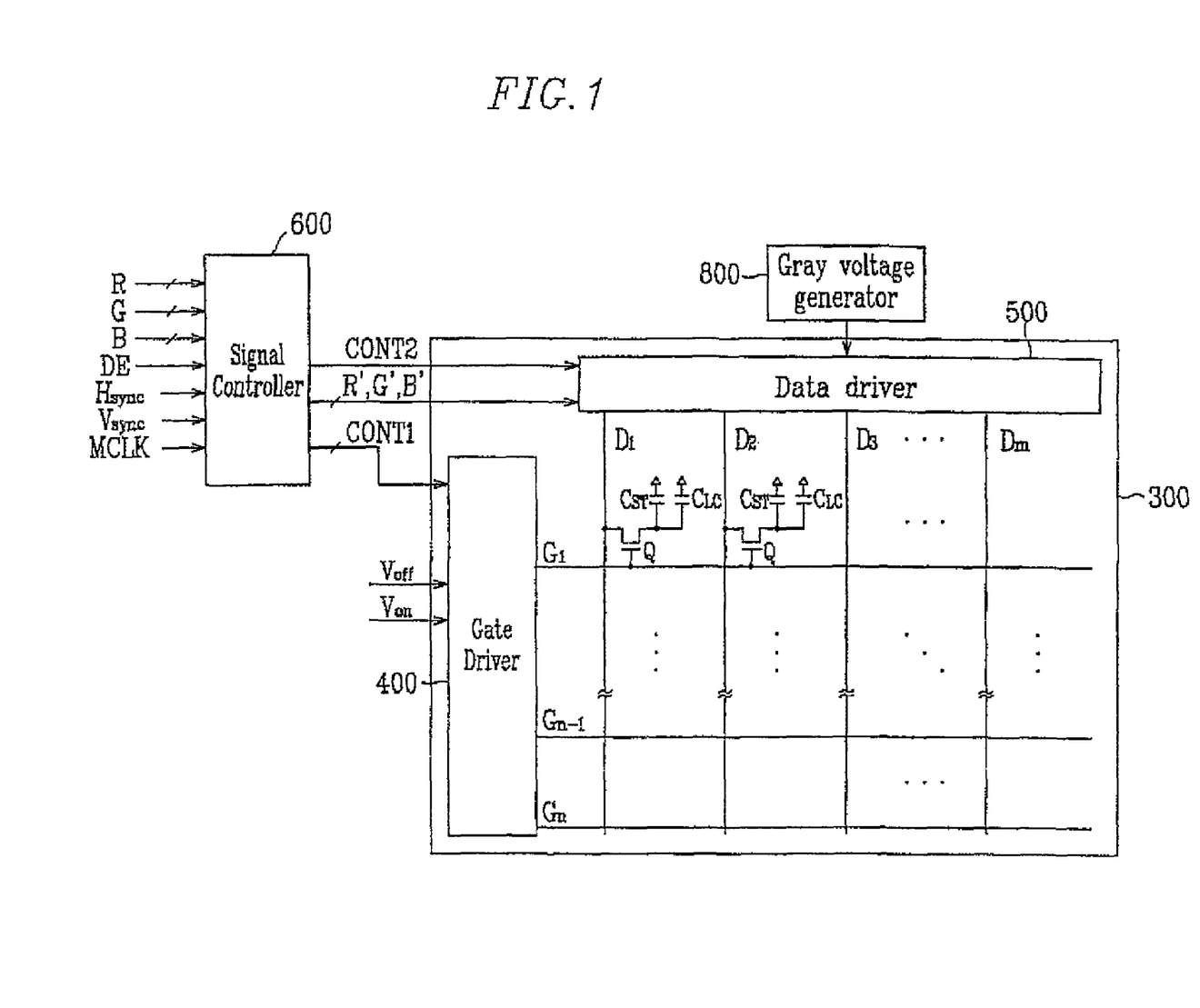
FIG. 1 is a block diagram of an LCD according to an embodiment of the present invention.
Figure 2:
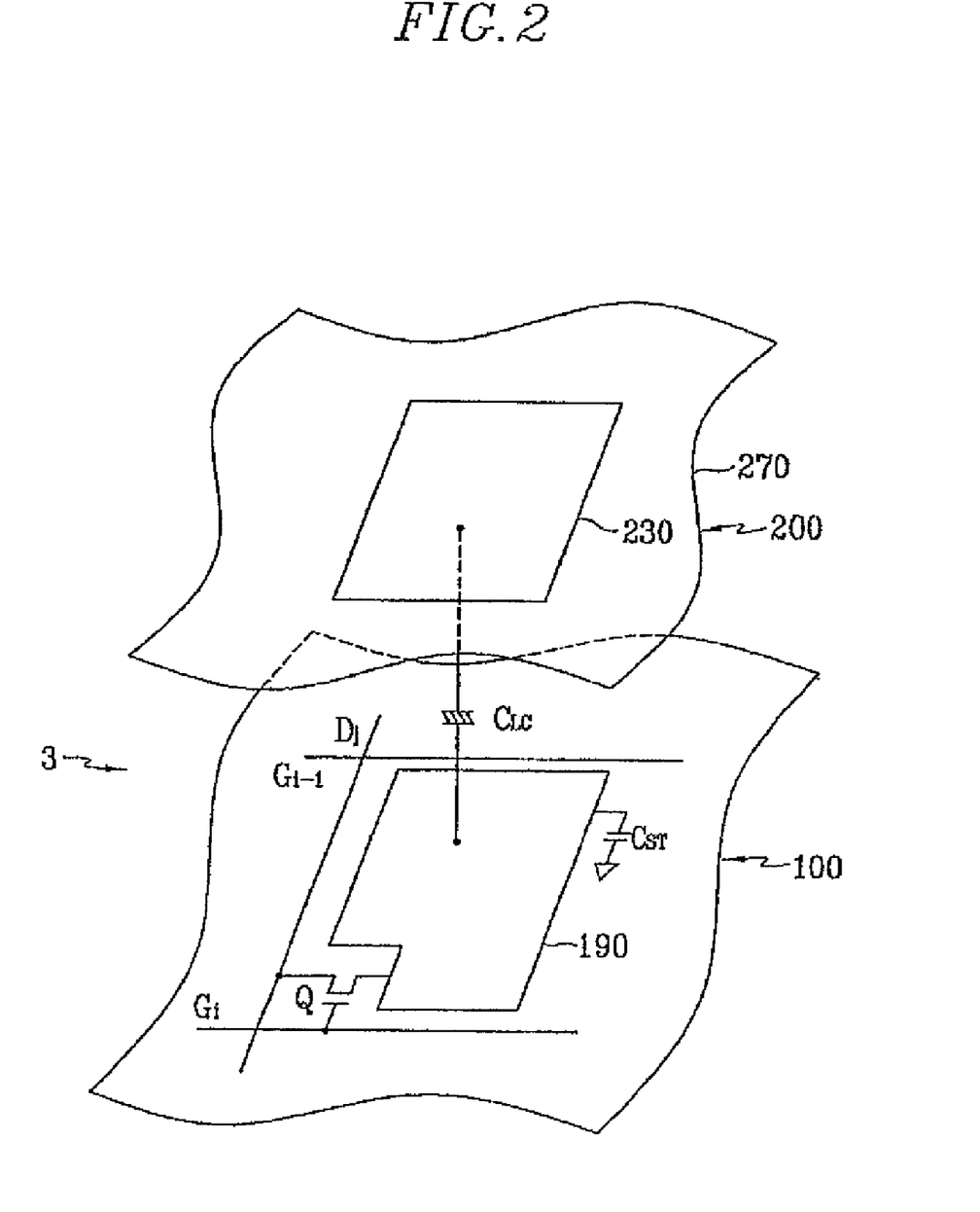
FIG. 2 is an equivalent circuit diagram of a pixel of an LCD according to an embodiment of the present invention.

Referring to FIGS. 1 and 2, an LCD according to an embodiment of the present invention will be described in detail.

FIG. 1 is a block diagram of an LCD according to an embodiment of the present invention, and FIG. 2 is an equivalent circuit diagram of a pixel of an LCD according to an embodiment of the present invention.

Referring to FIG. 1, an LCD according to an embodiment includes a LC panel assembly 300, a gate driver 400 and a data driver 500 that are connected to the panel assembly 300, a gray voltage generator 800 connected to the data driver 500, and a signal controller 600 controlling the above elements.

Referring to FIG. 1, the panel assembly 300 includes a plurality of display signal lines $G_1$-$G_n$, and $D_1$-$D_m$ and a plurality of pixels connected thereto and arranged substantially in a matrix. In a structural view shown in FIG. 2, the panel assembly 300 includes lower and upper panels 100 and 200 and a LC layer interposed therebetween.

The display signal lines $G_1$-$G_n$, and $D_1$-$D_m$ are disposed on the lower panel 100 and include a plurality of gate lines $G_1$-$G_n$ transmitting gate signals (also referred to as "scanning signals"), and a plurality of data lines $D_1$-$D_m$ transmitting data signals. The gate lines $G_1$-$G_n$ extend substantially in a row direction and substantially parallel to each other, while the data lines $D_1$-$D_m$ extend substantially in a column direction and substantially parallel to each other.

Each pixel includes a switching element Q connected to the signal lines $G_1$-$G_n$ and $D_1$-$D_m$, and a LC capacitor $C_{LC}$ and a storage capacitor $C_{ST}$ that are connected to the switching element Q. If unnecessary, the storage capacitor $C_{ST}$ may be omitted.

The switching element Q including a TFT is provided on a lower panel 100 and has three terminals: a control terminal connected to one of the gate lines $G_1$-$G_n$; an input terminal connected to one of the data lines $D_1$-$D_m$; and an output terminal connected to both the LC capacitor $C_{LC}$ and the storage capacitor $C_{ST}$.

The LC capacitor $C_{LC}$ includes a pixel electrode 190 provided on the lower panel 100 and a common electrode 270 provided on an upper panel 200 as two terminals. The LC layer 3 disposed between the two electrodes 190 and 270 functions as dielectric of the LC capacitor $C_{LC}$. The pixel electrode 190 is connected to the switching element Q, and the common electrode 270 is supplied with a common voltage Vcom and covers an entire surface of the upper panel 200. Unlike FIG. 2, the common electrode 270 may be provided on the lower panel 100, and both electrodes 190 and 270 may have shapes of bars or stripes.

The storage capacitor $C_{ST}$ is an auxiliary capacitor for the LC capacitor $C_{LC}$. The storage capacitor $C_{ST}$ includes the pixel electrode 190 and a separate signal line, which is provided on the lower panel 100, overlaps the pixel electrode 190 via an insulator, and is supplied with a predetermined voltage such as the common voltage Vcom. Alternatively, the storage capacitor $C_{ST}$ includes the pixel electrode 190 and an adjacent gate line called a previous gate line, which overlaps the pixel electrode 190 via an insulator For color display, each pixel uniquely represents one of three primary colors (i.e., spatial division) or each pixel represents three primary colors in turn (i.e., time division) such that spatial or temporal sum of the three primary colors are recognized as a desired color. FIG. 2 shows an example of the spatial division that each pixel is provided with a color filter 230, one of red, green and blue color filters, in an area of the upper panel 200 facing the pixel electrode 190. Alternatively, the color filter 230 is provided on or under the pixel electrode 190 on the lower panel 100.

One or more polarizers (not shown) are attached to the panels 100 and 200.

Referring to FIG. 1 again, the gray voltage generator 800 generates two sets of a plurality of gray voltages related to the transmittance of the pixels. The gray voltages in one set have a positive polarity with respect to the common voltage Vcom, while those in the other set have a negative polarity with respect to the common voltage Vcom.

The gate driver 400 is connected to the gate lines $G_1$-$G_n$ of the panel assembly 300 and synthesizes the gate-on voltage Von and the gate-off voltage Voff from an external device to generate gate signals for application to the gate lines $G_1$-$G_n$. The gate driver 400 is mounted on the panel assembly 300 and it may include a plurality of IC (integrated circuit) chips.

The data driver 500 is connected to the data lines $D_1$-$D_m$ of the panel assembly 300 and applies data voltages, which are selected from the gray voltages supplied from the gray voltage generator 800, to the data lines $D_1$-$D_m$. The data driver 500 is also mounted on the panel assembly 300 and it may include a plurality of IC chips, too.

The IC chips of the drivers 400 and 500 may be mounted on flexible printed circuit (FPC) films in a TCP (tape carrier package) type which are attached to the LC panel assembly 300. Alternately, the drivers 400 and 500 may be integrated into the panel assembly 300 along with the display signal lines $G_1$-$G_n$ and $D_1$-$D_m$ and the TFT switching elements Q.

The signal controller 600 controls the gate driver 400 and the data driver 500 and it may be mounted on a printed circuit board (PCB).

A detailed example of the LCD shown in FIGS. 1 and 2 is now described with reference to FIGS. 3 and 4.

Figure 3:
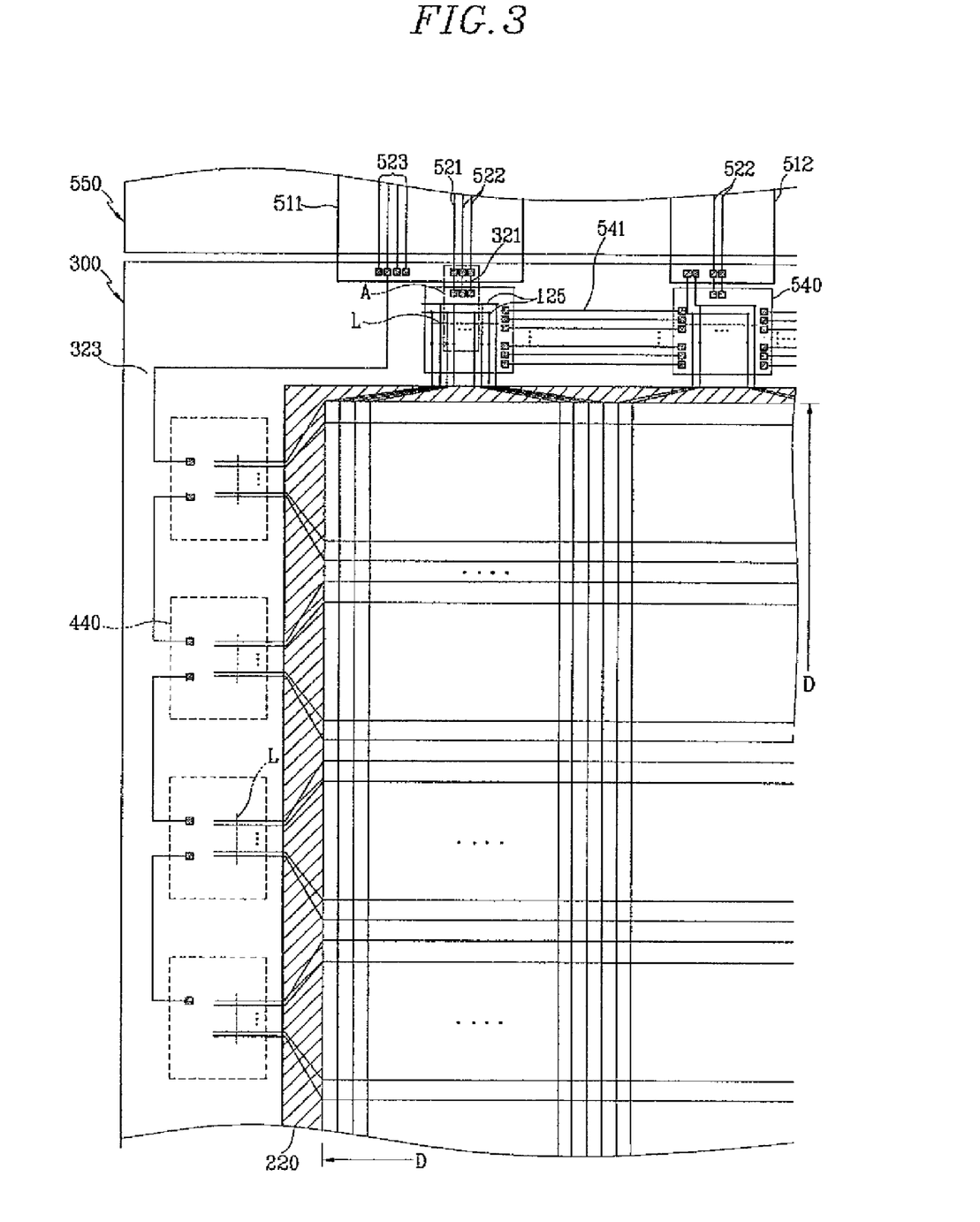
FIG. 3 is a schematic layout view of an LCD according to an embodiment of the present invention.
Figure 4:
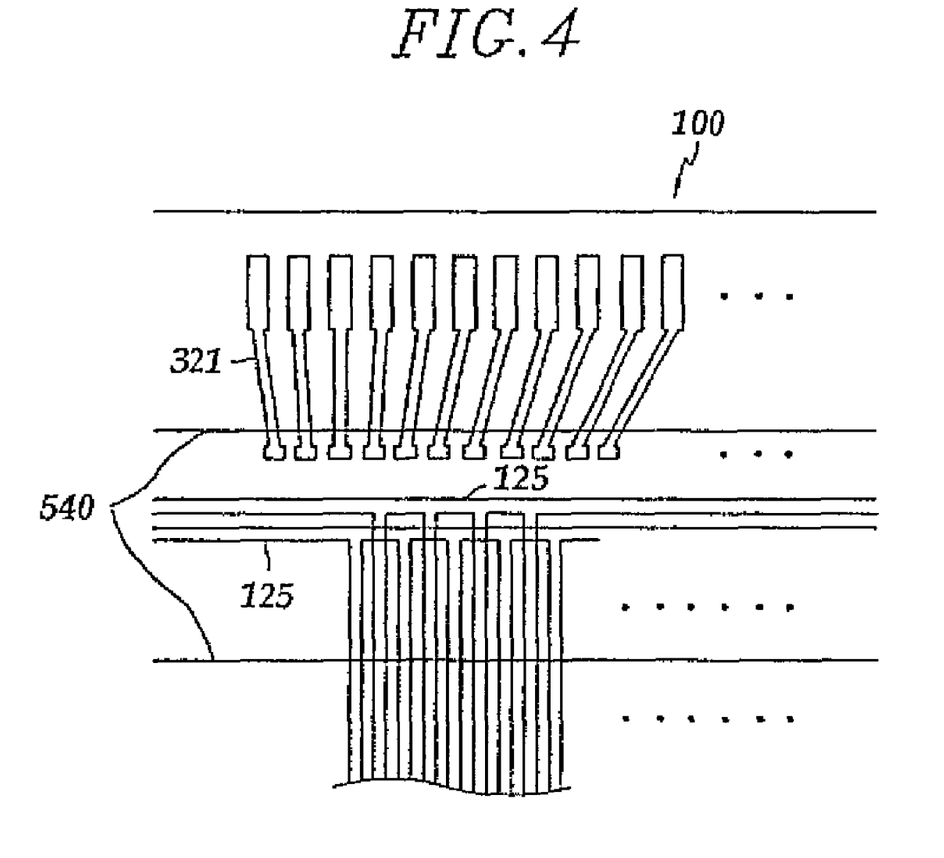
FIG. 4 is an expanded view of the LC panel assembly near a data driving IC shown in FIG. 3.

FIG. 3 is a schematic layout view of an LCD according to an embodiment of the present invention, and FIG. 4 is an expanded view of the LC panel assembly near a data driving IC shown in FIG. 3.

As shown in FIGS. 3 and 4, a panel assembly 300 includes a plurality of gate lines and a plurality of data lines. A plurality of gate driving IC chips 440 and a plurality of data driving IC chips 540 are mounted on the panel assembly 300. The gate driving IC chips 440 are disposed near a left edge of the panel assembly 300 and the data driving IC chips 540 are disposed near a top edge of the panel assembly 300. A PCB 550 is disposed near a top edge of the panel assembly 300 and several circuit elements such as a signal controller 600 and a gray voltage generator 800 are provided on the PCB 550. The panel assembly 300 and the PCB 550 are electrically and physically interconnected by a plurality of FPC films 511 and 512.

The leftmost FPC film 511 includes a plurality of data transmission lines 521 and a plurality of driving signal lines 522 and 523. The data transmission lines 521 for transmitting image data are connected to input terminals of the data driving IC chips 540. The driving signal lines 522 and 523 transmit electrical voltages and control signals for activating the driving IC chips 540 and 440 via driving signal lines 321 and 323 disposed on the panel assembly 300.

The remaining FPC films 512 include a plurality of driving signal lines 522 transmitting electrical voltages and control signals to the data driving IC chips 540 electrically connected thereto.

The signal lines 521-523 are connected to the circuit elements on the PCB 550 and receive signals therefrom.

Alternatively, the driving signal lines 523 may be provided on a separate FPC film (not shown).

As shown in FIGS. 3 and 4, a plurality of pixel areas defined by the intersections of the gate lines extending in the transverse direction and the data lines extending in the longitudinal direction form a display area D on the panel assembly 300. A light blocking member 220 (indicated by hatched area) for blocking light leakage exterior to the display area D is disposed around the display area D.

Although the gate lines as well as the data lines extend substantially parallel to each other in the display area D, they approach each other group by group like a fan and then become parallel again as they go away from the display area D. Such an area is referred to as a fan-out area.

The data driving IC chips 540 are disposed outside of the display area D and sequentially arranged in the transverse direction. Adjacent data driving IC chips 540 are connected by a plurality of interconnections 541 and the image data transmitted from the leftmost FPC film 511 to the leftmost data driving IC 540 are then transmitted to the next data driving IC 540 via the interconnections 541, and so on.

A plurality of inspection lines 125 are formed on the panel assembly 300 and two inspection lines 125 are disposed under each of the data driving IC chips 540. Each of the inspection lines 125 extends substantially in the transverse direction and curves upward and it includes an inspection pad. The data lines are alternately connected to the inspection lines 125. The number of the inspection lines 125 may be varied.

The gate driving IC chips 440 are mounted near the left edges of the panel assembly 300 external to the display area D and arranged in the column direction. The driving signal lines 323 are located near the gate driving IC chips 440 and electrically connect the driving signal lines 523 of the leftmost FPC film 511 to the uppermost gate driving IC 440 or electrically connect the gate driving IC chips 440.

As described above, the LC panel assembly 300 includes the two panels 100 and 200, and one of the panels 100 and 200 provided with the TFTs is referred to as "TFT array panel." The signal lines 321 and 323 and the interconnections 541 are provided on the TFT array panel 100.

An exemplary TFT array panel for an LCD according to an embodiment of the present invention is now described in detail with reference to FIGS. 5-9 as well as FIGS. 3 and 4.

Figure 5:
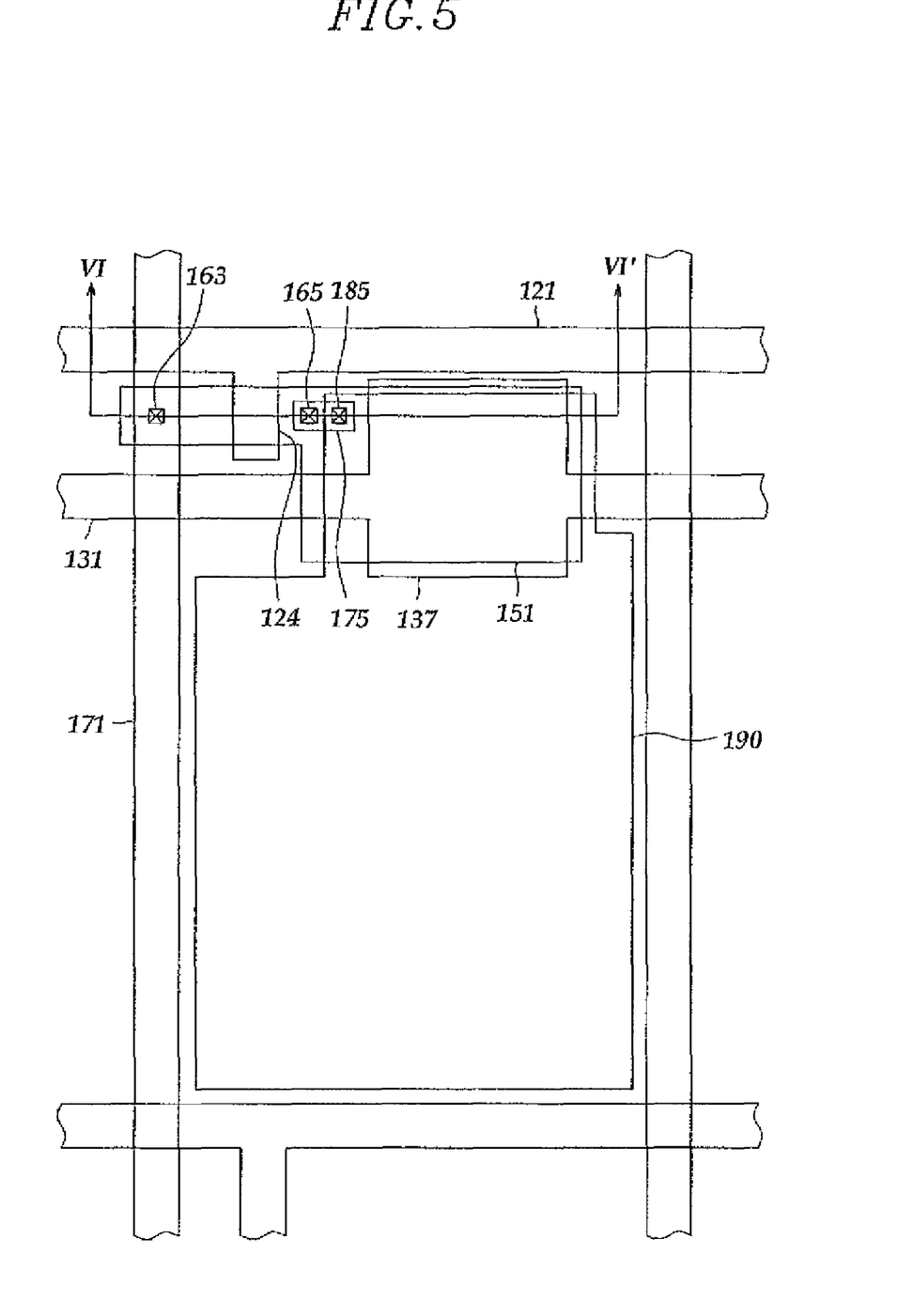
FIG. 5 is an exemplary layout view of a display area of the TFT array panel shown in FIGS. 1-4.
Figure 6:
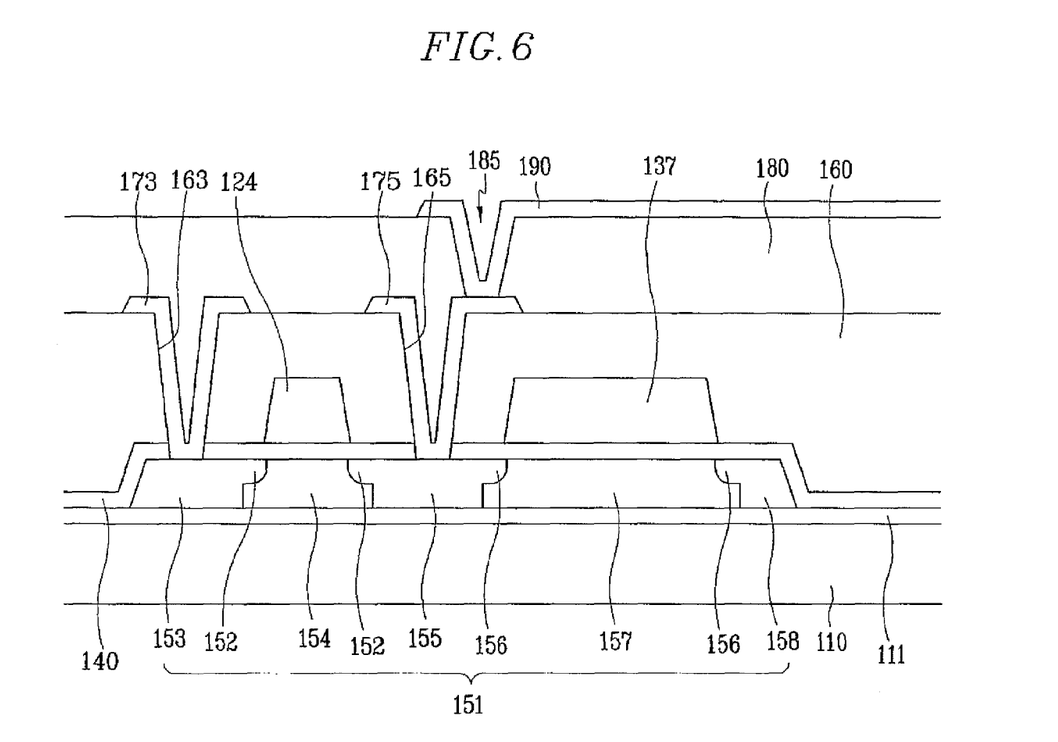
FIG. 6 is a sectional view of the display area shown in FIG. 5 taken along the lines VI-VI'.
Figure 7:
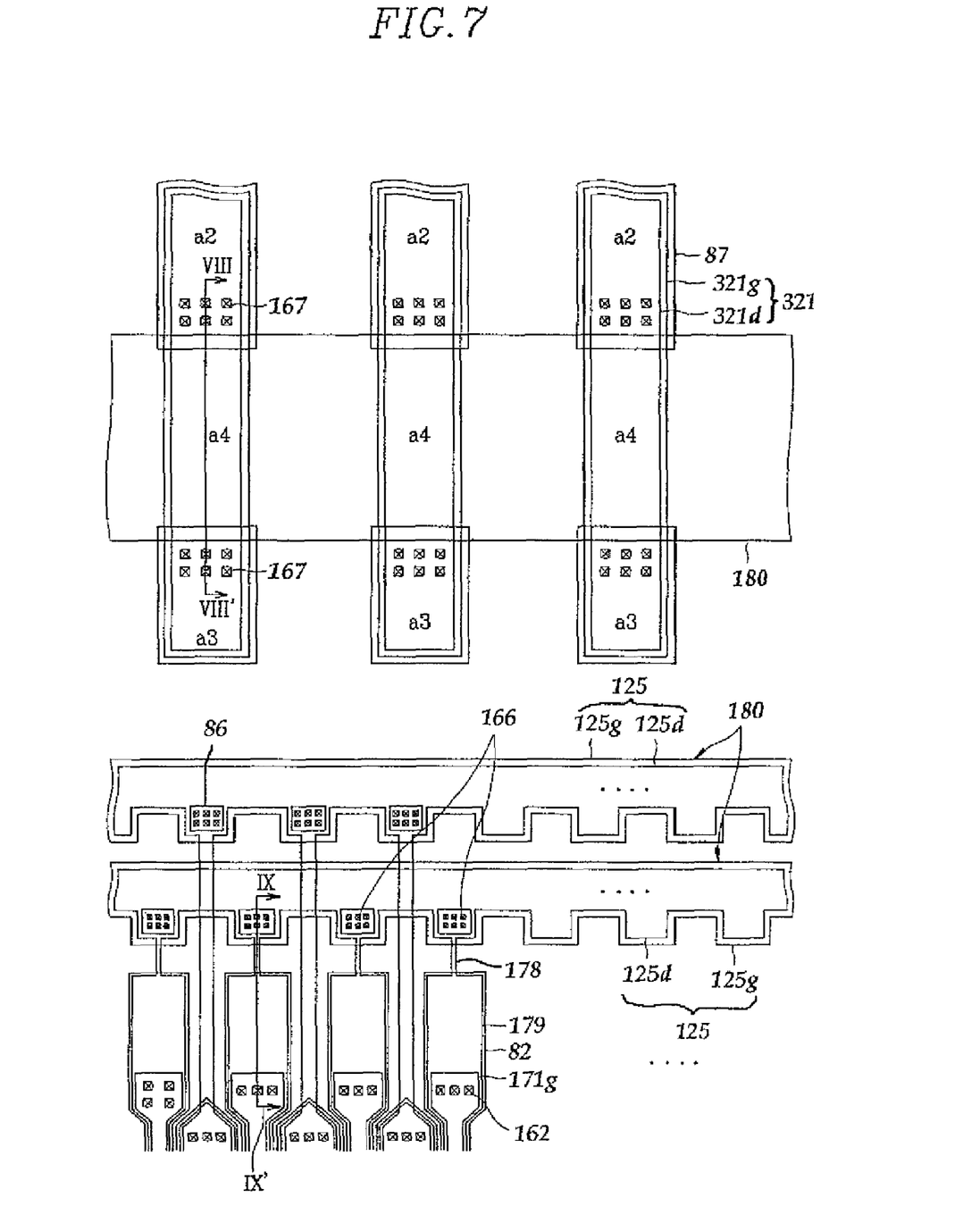
FIG. 7 is a an exemplary layout view of a peripheral area of the TFT array panel shown in FIGS. 1-4 near a data driver.
Figure 8:
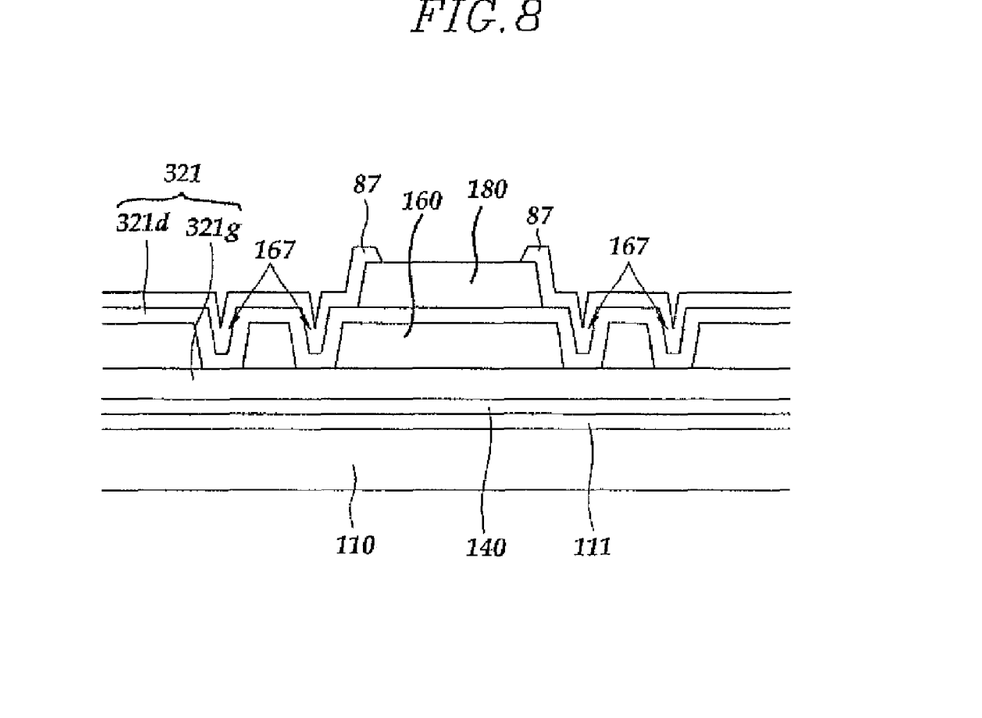
FIGS. 8 and 9 are sectional views of the peripheral area shown in FIG. 7 taken along the lines VIII-VIII' and IX-IX', respectively.
Figure 9:
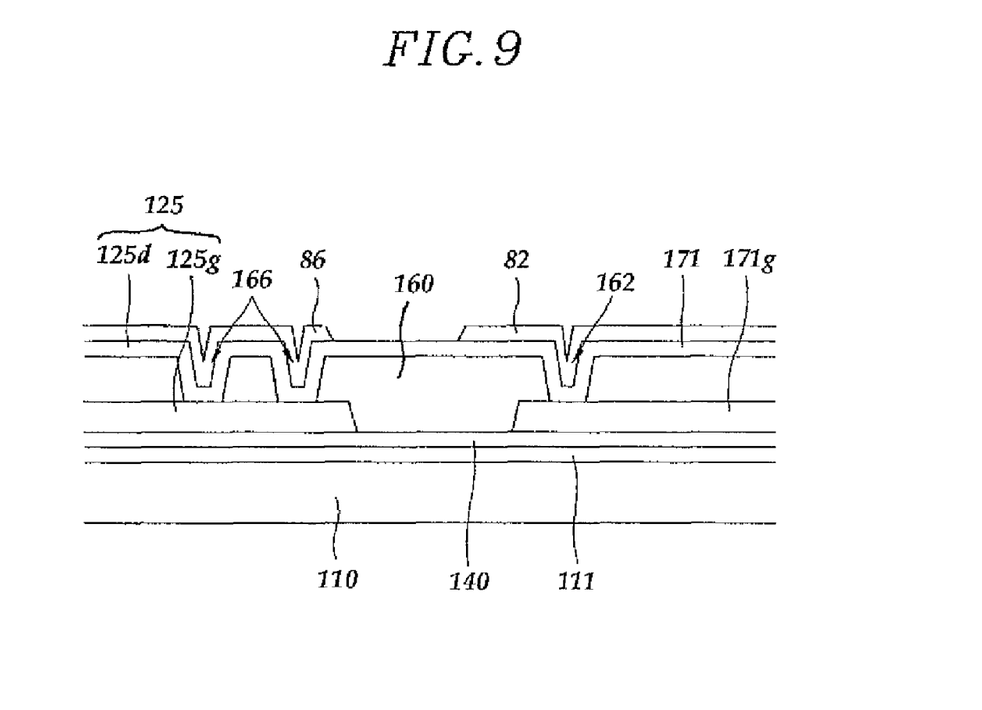

FIG. 5 is an exemplary layout view of a display area of the TFT array panel shown in FIGS. 1-4, and FIG. 6 is a sectional view of the display area shown in FIG. 5 taken along the lines VI-VI'. FIG. 7 is a an exemplary layout view of a peripheral area of the TFT array panel shown in FIGS. 1-4 near a data driver, and FIGS. 8 and 9 are sectional views of the peripheral area shown in FIG. 7 taken along the lines VIII-VIII' and IX-IX', respectively.

A blocking film 111 preferably made of silicon oxide ($SiO_2$) or silicon nitride (SiNx) is formed on a transparent insulating substrate 110. The blocking film 111 may have a dual-layered structure.

A plurality of semiconductor islands 151 preferably made of polysilicon are formed on the blocking film 111. Each of the semiconductor islands 151 includes a plurality of extrinsic regions containing conductive impurity, which include a plurality of heavily doped regions and a plurality of lightly doped regions, and a plurality of intrinsic regions hardly containing conductive impurity. The intrinsic regions include a channel region 154 and a storage region 157, and the highly doped regions include source and drain regions 153 and 155 separated from each other with respect to the channel region 154 and dummy regions 158. The lightly doped regions 152 and 156 are narrow and disposed between the intrinsic regions 154 and 157 and the heavily doped regions 153, 155 and 158. In particular, the lightly doped regions 152 disposed between the source region 153 and the channel region 154 and between the drain region 155 and the channel region 154 are referred to as "lightly doped drain (LDD) regions."

The conductive impurity includes P type impurity such as boron (B) and gallium (Ga) and N type impurity such as phosphorous (P) and arsenic (As). The lightly doped regions 152 and 156 prevent leakage current of TFTs and are substituted with offset regions that contain substantially no impurity.

A gate insulating layer 140 preferably made of silicon nitride (SiNx) is formed on the semiconductor islands 151 and the blocking film 111.

A plurality of gate conductors including a plurality of gate lines 121, a plurality of storage electrode lines 131, a plurality of pairs of lower inspection lines 125g, a plurality of lower driving signal lines 321g, and a plurality of auxiliary data lines 171g are formed on an insulating substrate 110.

The gate lines 121 for transmitting gate signals extend substantially in a transverse direction and include a plurality of gate electrodes 124 protruding downward to overlap the channel areas 154 of the semiconductor islands 151. The gate electrodes 124 may further overlap the lightly doped regions 152. Each gate Line 121 may include an expanded end portion having a large area for contact with another layer or an external driving circuit. The gate lines 121 may be directly connected to a gate driving circuit for generating the gate signals, which may be integrated on the substrate 110.

The storage electrode lines 131 are supplied with a predetermined voltage such as a common voltage and include a plurality of storage electrodes 137 protruding upward and downward and overlapping the storage regions 157 of the semiconductor islands 151.

Each of the lower inspection lines 125g extends substantially in the transverse direction and it has a rectilinear upper edge and a periodically-curved lower edge having convexities and concavities like a rectangular waveform. The convexities and the concavities alternate in each pair of the lower inspection lines 125g.

The lower driving signal lines 321g extend substantially in a longitudinal direction and they may have end portions having a large area.

Each of the auxiliary data lines 171g extends substantially in the longitudinal direction and it has an end portion having a large area.

The gate conductors 121, 131, 125g, 321g and 171g are preferably made of low resistivity material including Al containing metal such as Al and Al alloy (e.g. Al—Nd), Ag containing metal such as Ag and Ag alloy, and Cu containing metal such as Cu and Cu alloy. The gate conductors 121, 131, 125g, 321g and 171g may have a multi-layered structure including two films having different physical characteristics. One of the two films is preferably made of low resistivity metal including Al containing metal, Ag containing metal, and Cu containing metal for reducing signal delay or voltage drop in the gate conductors 121, 131, 125g, 321g and 171g. The other film is preferably made of material such as Cr, Mo and Mo alloy, Ta or Ti, which has good physical, chemical, and electrical contact characteristics with other materials such as indium tin oxide (ITO) or indium zinc oxide (IZO). Good examples of the combination of the two films are a lower Cr film and an upper Al—Nd alloy film and a lower Al film and an upper Mo film.

In addition, the lateral sides of the gate conductors 121, 131, 125g, 321g and 171g are inclined relative to a surface of the substrate 110, and the inclination angle thereof ranges about 30-80 degrees.

An interlayer insulating layer 160 is formed on the gate conductors 121, 131, 125g, 321g and 171g. The interlayer insulating layer 160 is preferably made of photosensitive organic material having a good flatness characteristic, low dielectric insulating material such as a-Si:C:O and a-Si:O:F formed by plasma enhanced chemical vapor deposition (PECVD), or inorganic material such as silicon nitride and silicon oxide.

The interlayer insulating layer 160 has a plurality of contact holes 162, 166 and 167 exposing the end portions of the auxiliary data lines 171g, the convexities of the lower inspection lines 125g, and both end portions of the lower driving signal lines 321g, respectively. In addition, the interlayer insulating layer 160 and the gate insulating layer 140 have a plurality of contact holes 163 and 165 exposing the source regions 153 and the drain electrodes 175, respectively. A number of contact holes 162, 166 and 167 are disposed on each of the end portions of the auxiliary data lines 171g, the convexities of the lower inspection lines 125g, and the end portions of the lower driving signal lines 321g.

A plurality of data conductors including a plurality of data lines 171, a plurality of drain electrodes 175, a plurality of pairs of upper inspection lines 125d, and a plurality of lower driving signal lines 321d are formed on the interlayer insulating layer 160.

The data lines 171 for transmitting data voltages extend substantially in the longitudinal direction and intersect the gate lines 121 and they are connected to the auxiliary data lines 171g through the contact holes 162 at the end portions of the auxiliary data lines 171g. Each data line 171 includes a plurality of source electrodes 173 connected to the source regions 153 through the contact holes 163, an expansion 179, and an extension 178 connected to the expansion 179 and an upper inspection line 125d. The expansions 179 of the data lines 171 partly overlap the end portions of the auxiliary data lines 171g, but considerable portions of the expansions 179 do not overlap the end portions of the auxiliary data lines 171g.

The drain electrodes 175 are separated from the source electrodes 173 and connected to the drain regions 155 through the contact holes 165.

The upper inspection lines 125d are disposed on the lower inspection lines 125g and extend along the lower inspection lines 125g such that a pair of lower and upper inspection lines 125g and 125d form an inspection line 125. Each of the upper inspection lines 125d also has a rectilinear upper edge and a periodically-curved lower edge having convexities and concavities following those of the lower inspection lines 125g. The lower and the upper inspection lines 125g and 125d are connected to each other through the contact holes 166 at their convexities.

The upper driving signal lines 321d are disposed on the lower driving signal lines 321g and extend along the lower driving signal lines 321g such that a pair of lower and upper driving signal lines 321g and 321d form a driving signal line 321. Each driving signal line 321 includes an input end a2 to be connected to a FPC film (not shown), an output end a3 to be connected to a data driving IC chip, and an intermediate portion a4 connected between the input end a2 and the output end a3.

The data conductors 171, 175, 125d and 321d are preferably made of refractory metal including Cr, Mo, Ti, Ta or alloys thereof. They may have a multi-layered structure preferably including a low resistivity film and a good contact film. A good example of the multi-layered structure includes a Mo lower film, an Al middle film, and a Mo upper film as well as the above-described combinations of a Cr lower film and an Al—Nd upper film and an Al lower film and a Mo upper film. Another example of the multi-layered structure is a Cr lower film and a MoW upper film.

Like the gate conductors 121, 131, 125g, 321g and 171g, the data conductors 171, 175, 125d and 321d have tapered lateral sides relative to a surface of the substrate 110, and the inclination angles thereof range about 30-80 degrees.

A passivation layer 180 is formed on the data conductors 171, 175, 125d and 321d, and the interlayer insulating layer 160. The passivation layer 180 is also preferably made of photosensitive organic material having a good flatness characteristic, low dielectric insulating material such as a-Si:C:O and a-Si:O:F formed by PECVD, or inorganic material such as silicon nitride and silicon oxide.

The passivation layer 180 is not provided at the positions where the data driving IC chips 540 and the end portions of the driving signal lines 321 are disposed. However, the passivation layer 180 covers the intermediate portions a4 of the driving signal lines 321 and it has a plurality of contact holes 185 the drain electrodes 175.

A plurality of pixel electrodes 190 and a plurality of contact assistants 82, 86 and 87, which are preferably made of at least one of transparent conductor such as ITO or IZO and opaque reflective conductor such as Al or Ag, are formed on the passivation layer 180 or the interlayer insulating layer 160.

The pixel electrodes 190 are physically and electrically connected to the drain electrodes 175 through the contact holes 185 such that the pixel electrodes 190 receive the data voltages from the drain regions 155 via the drain electrodes 175.

Referring back to FIG. 2, the pixel electrodes 190 supplied with the data voltages generate electric fields in cooperation with the common electrode 270 on the other panel 200, which determine orientations of liquid crystal molecules in a liquid crystal layer 3 disposed therebetween or cause currents in light emitting members (not shown) disposed therebetween.

As described above, a pixel electrode 190 and a common electrode form a liquid crystal capacitor and a pixel electrode 190 and a drain region 155 connected thereto and a storage electrode line 131 including storage electrodes 137 form a storage capacitor.

The pixel electrodes 190 may overlap the gate lines 121 and the data lines 171 to increase aperture ratio particularly when the passivation layer 180 is made of low dielectric insulator.

The contact assistants 82, 86 and 87 are disposed on the contact holes 162, 166 and 167 to be connected to the expansions 179 of the data lines 171, the convexities of the inspection lines 125, and the end portions of the driving signal lines 321, respectively. The contact assistants 82 almost fully cover the expansions 179 of the data lines 171, but they may be disposed only near the contact holes 162. The contact assistants 86 are disposed only near the contact holes 166, but they may be connected to one another and extend along the inspection lines 125. The contact assistants 87 occupy considerable areas on the end portions of the driving signal lines 321 and they have portions disposed on the passivation layer 180 to fully cover the exposed portions of the driving signal lines 321. Since the upper driving signal lines 321d extend along the lower driving signal lines 321g in a single body, the driving signal lines 321 are not disconnected even though there is a defect in the contact between the lower driving signal lines 321g and the upper driving signal lines 321d at the contact holes 167. In addition, since the edges of the contact assistants 87 are disposed on the passivation layer 180 and there is no edge of the upper driving signal lines 321d between the contact holes 167 and the edges of the contact assistants 87 on the passivation layer 180, the possibility that etchant for etching the contact assistants 87 intrudes edges do not contact the lower driving signal lines 321g.

In this way, the contact assistants 82, 86 and 87 protect the exposed portions to prevent corrosion and complement the adhesion between the exposed portions and the driving IC chips 540. When the pixel electrodes 190 include a transparent conductor (not shown) and a reflective conductor (not shown), the contact assistants 82, 86 and 87 may include one of the two conductors.

A driving IC chip 540 having input bumps (not shown) and output bumps (not shown) is mounted on the TFT array panel 100.

Some of the output bumps of the driving IC chip 540 are disposed on the expansions 179 of the data lines 171 and the contact assistants 82 such that the bumps are aligned not to overlap the auxiliary data lines 171. This configuration is advantageous in case that the bumps and the expansions 179 of the data lines 171 are short-circuited by laser illumination for repairing contact defect therebetween. It is because the laser illumination may contact the contact assistants 87 with the auxiliary data lines 171g to cause corrosion therebetween if the auxiliary data lines 171g are disposed under the bumps.

Some of the input bumps of the driving IC chip 540 are disposed on one end portions of the driving signal lines 321 and the contact assistants 87.

The above-described contact structures can be employed to the gate lines 121 and the gate driver 400.

Now, the operation of the above-described LCD will be described in detail.

The signal controller 600 is supplied with input image signals R, G and B and input control signals controlling the display thereof such as a vertical synchronization signal Vsync, a horizontal synchronization signal Hsync, a main clock MCLK, and a data enable signal DE, from an external graphics controller (not shown). After generating gate control signals CONT1 and data control signals CONT2 and processing the image signals R, G and B suitable for the operation of the panel assembly 300 on the basis of the input control signals and the input image signals R, G and B, the signal controller 600 transmits the gate control signals CONT1 to the gate driver 400, and the processed image signals R', G' and B' and the data control signals CONT2 to the data driver 500, through the signal lines 521-523 and the driving signal lines 321 and 323.

The gate control signals CONT1 include a scanning start signal STV for instructing to start scanning and at least a clock signal for controlling the output time of the gate-on voltage Von. The gate control signals CONT1 may further include an output enable signal OE for defining the duration of die gate-on voltage Von.

The data control signals CONT2 include a horizontal synchronization start signal STH for informing of start of a horizontal period, a load signal LOAD for instructing to apply the data voltages to the data lines $D_1$-$D_m$, a inversion control signal RVS for reversing the polarity of the data voltages (with respect to the common voltage Vcom), and a data clock signal HCLK.

The data driver 500 receives a packet of the image data R', G' and B' for a pixel row from the signal controller 600 and converts the image data R', G' and B' into analog data voltages selected from the gray voltages supplied from the gray voltage generator 800 in response to the data control signals CONT2 from the signal controller 600. Thereafter, the data driver 500 applies the data voltages to the data lines $D_1$-$D_m$.

Responsive to the gate control signals CONT1 from the signal controller 600, the gate driver 400 applies the gate-on voltage Von to the gate line $G_1$-$G_n$, thereby turning on the switching elements Q connected thereto. The data voltages applied to the data lines D1-Dm are supplied to the pixels through the activated switching elements Q.

The difference between the data voltage and the common voltage Vcom is represented as a voltage across the LC capacitor $C_{LC}$, i.e., a pixel voltage. The LC molecules in the LC capacitor $C_{LC}$ have orientations depending on the magnitude of the pixel voltage, and the molecular orientations determine the polarization of light passing through the LC layer 3. The polarizer(s) converts the light polarization into the light transmittance.

By repeating this procedure by a unit of the horizontal period (which is indicated by 1H and equal to one period of the horizontal synchronization signal Hsync and the data enable signal DE), all gate lines $G_1$-$G_n$ are sequentially supplied with the gate-on voltage Von during a frame, thereby applying the data voltages to all pixels. When the next frame starts after finishing one frame, the inversion control signal RVS applied to the data driver 500 is controlled such that the polarity of the data voltages is reversed (which is called "frame inversion"). The inversion control signal RVS may be also controlled such that the polarity of the data voltages flowing in a data line in one frame are reversed (for example, line inversion and dot inversion), or the polarity of the data voltages in one packet are reversed (for example, column inversion and dot inversion).

This process will be described in more detail.

After receiving the scanning start signal STV, the uppermost gate driving IC 440 selects the gate-on voltage Von among the two voltages Von and Voff and outputs to the first gate lines $G_1$. The remaining gate lines $G_2$-$G_n$ are supplied with the gate-off voltage Voff. The switching elements Q connected to the first gate line $G_1$ are turned on upon the application of the gate-on voltage Von, and the data voltages for the first pixel row are applied to the LC capacitors $C_{LC}$ and the storage capacitors $C_{ST}$ in the first pixel row through the activated switching elements Q. After charging the capacitors $C_{LC}$ and $C_{ST}$ of the first pixel row, the uppermost gate driving IC 440 applies the gate-off voltage Voff to the first gate line $G_1$ to turn off the switching elements Q connected thereto, and applies the gate-on voltage Von to the second gate line $G_2$.

By repeating this procedure, the uppermost gate driving IC 440 applies the gate-on voltage Von to all the gate lines connected thereto, and outputs a carry signal for informing of the termination of the scanning to the next gate driving IC 440.

The second gate driving IC 440, after receiving the carry signal, scans all the gate lines connected thereto and generates a carry signal to be transmitted to the next gate driving IC 440 upon completion of the scanning.

In this way, the scanning of the remaining gate drive IC chips is completed and to the termination of the scanning of the lowermost gate driving IC 440 means the termination of one frame.

The above descriptions may be adapted to other flat panel display devices such as OLED.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A display panel comprising:
    a substrate;
    a gate line including a first conductive film;
    an auxiliary data line formed on the substrate and including the first conductive film;
    a data line intersecting the gate line and including a second conductive film, wherein the data line includes an expanded end portion including a contact portion contacting an input terminal of a driving circuit;
    a switching element connected to the gate line and the data line;
    a pixel electrode connected to the switching element and including a third conductive film;
    a first insulating layer formed between the first conductive film and the second conductive film and comprising a first contact hole exposing the auxiliary data line; and
    a first contact assistant including the third conductive film and disposed on the first contact hole,
    wherein the data line contacts the auxiliary data line through the first contact hole, and
    wherein the auxiliary data line is not expanded to overlap the contact portion.

2. The display panel of claim 1, further comprising an inspection line disposed near the end portion of the data line.

3. The display panel of claim 2, wherein the inspection line comprises the first and the second conductive films.

4. The display panel of claim 3, wherein the first insulating layer further comprises a second contact hole exposing the first conductive film of the inspection line, and
    the first conductive film of the inspection line contacts the second conductive film of the inspection line through the second contact hole.

5. The display panel of claim 4, further comprising a second contact assistant including the third conductive film and disposed on the second contact hole,
    wherein the first contact assistant contacts data lines and the second assistant contacts the second film of the inspection line.

6. The display panel of claim 5, wherein the first conductive film comprises Al or Al alloy and the second conductive film comprises Cr, Mo, or Mo alloy.

7. The display panel of claim 6, wherein the third conductive film comprises a transparent conductor or a reflective conductor.

8. The display panel of claim 7, wherein the switching element comprises a polysilicon film connected to the data line.

* * * * *